(12) United States Patent
Donde

(10) Patent No.: US 6,405,423 B1
(45) Date of Patent: Jun. 18, 2002

(54) METHOD FOR PRODUCING VACUUM PROCESSING CHAMBERS

(75) Inventor: Arik Donde, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/711,192

(22) Filed: Nov. 13, 2000

Related U.S. Application Data

(62) Division of application No. 09/151,187, filed on Sep. 10, 1998, now Pat. No. 6,182,851.

(51) Int. Cl.[7] .................................................. B23P 11/00
(52) U.S. Cl. ...................... 29/428; 29/DIG. 47; 72/254
(58) Field of Search .................................. 220/582, 555, 220/916, 676; 29/428, DIG. 47; 72/254, 368; 138/92, 114, 115

(56) References Cited

U.S. PATENT DOCUMENTS

| 2,071,728 A |   | 2/1937  | Bursitzky ................ 62/91.5 |
|---|---|---|---|
| 2,940,734 A |   | 6/1960  | Harvey ................... 257/208 |
| 3,515,302 A |   | 6/1970  | Curran ........................ 220/4 |
| 3,817,371 A |   | 6/1974  | Gatter ...................... 206/0.5 |
| 4,027,379 A |   | 6/1977  | Cheng et al. .......... 29/455 R |
| 4,340,462 A |   | 7/1982  | Koch ...................... 204/298 |
| 4,932,546 A | * | 6/1990  | Stannard |
| 5,564,587 A |   | 10/1996 | Falk et al. ................ 220/501 |
| 5,746,434 A |   | 5/1998  | Boyd et al. .................. 277/1 |
| 5,820,723 A |   | 10/1998 | Benjamin et al. ......... 156/345 |
| 5,983,829 A |   | 11/1999 | Suzuki ..................... 118/723 |
| 6,010,133 A |   | 1/2000  | Boyd et al. .............. 277/312 |
| 6,039,080 A | * | 3/2000  | Beijaard et al. |
| 6,290,085 B1 | * | 9/2001 | Tochigi |

* cited by examiner

Primary Examiner—David P. Bryant
(74) Attorney, Agent, or Firm—Roberts, Abokhair & Mardula; Joseph Bach

(57) ABSTRACT

A structure and method are present where a sidewall of a load lock chamber is formed by extrusion, to produce a reproducible tubular structure to form the walls of a vacuum chamber with greatly improved vacuum performance. The use of an extruded structure reduces the dimensional variability, increases the uniformity of a surface finish, and provides uniform top and bottom sealing arrangements, which allow full and easy access to the inside of the sidewalls for cleaning. In another arrangement heat transfer fluid passages can be formed in the wall of the chamber simultaneously as the wall of the chamber is extruded. Heating or cooling liquid can then be circulated through the passages in the wall of the chamber to heat the walls of the chamber as sometimes required to prevent condensation on the inside of the chamber walls, or provide cooling as is required for cool down of a wafer, after processing at an elevated temperature.

14 Claims, 8 Drawing Sheets

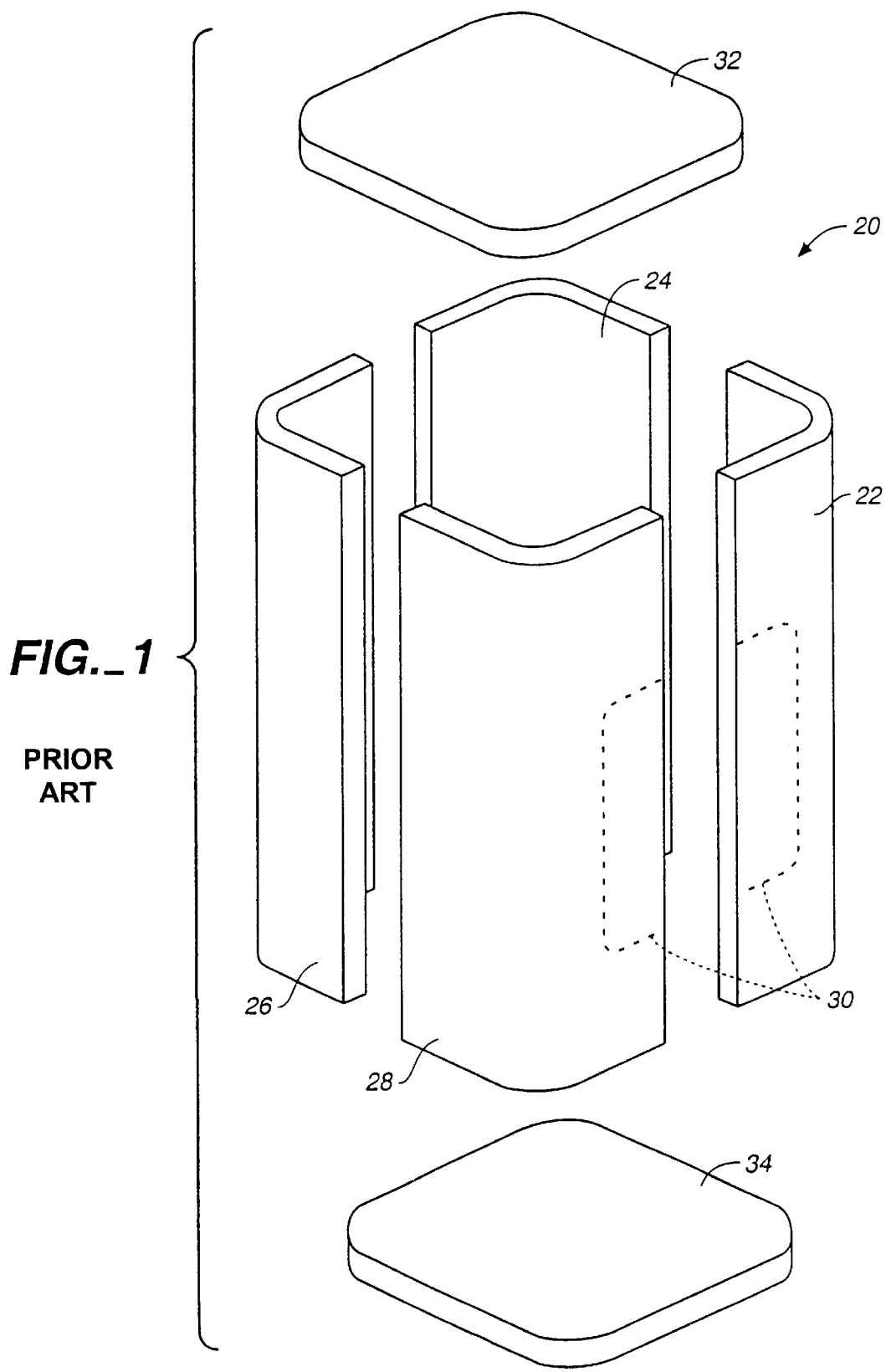
FIG._1
PRIOR ART

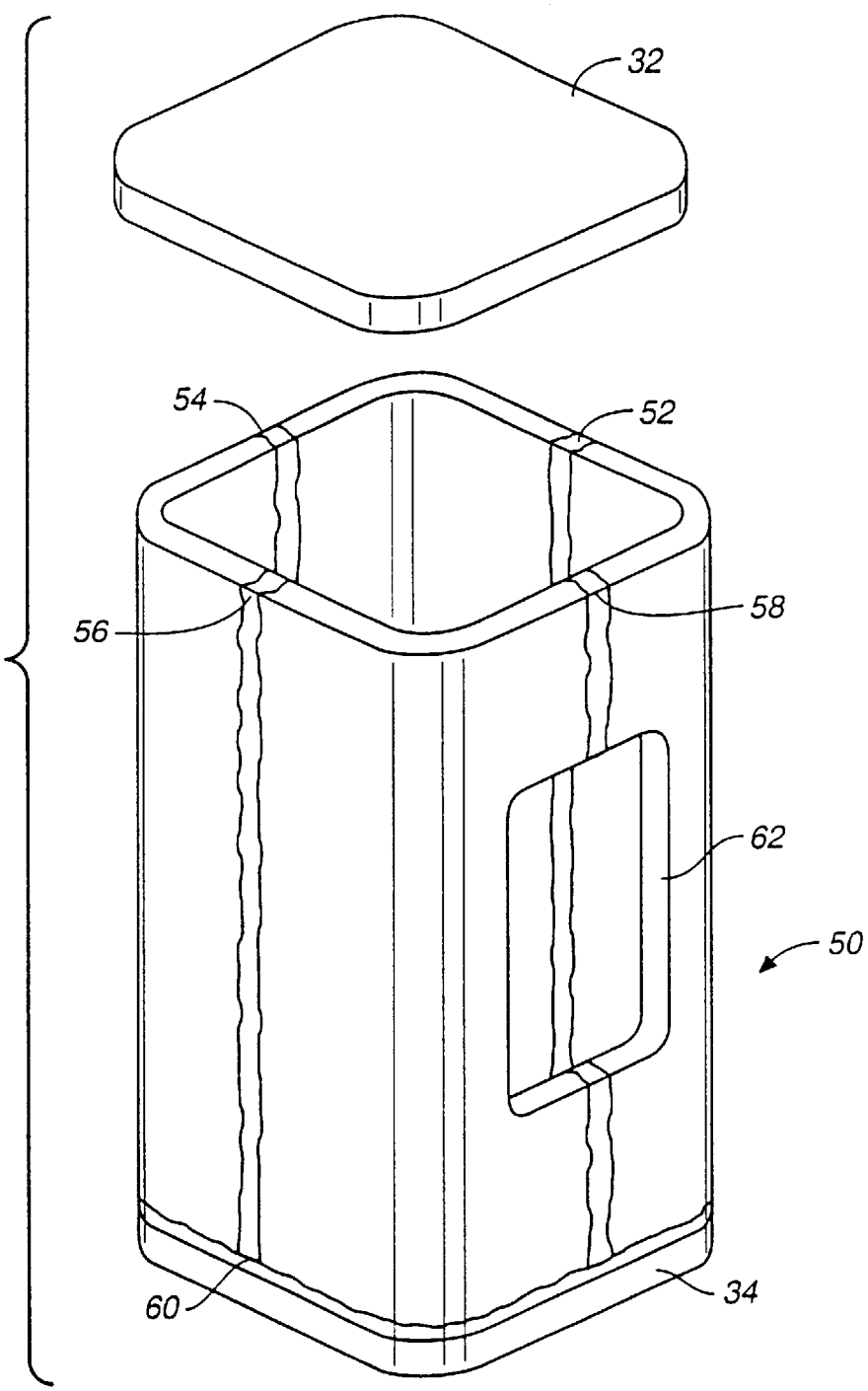
FIG._2
PRIOR ART

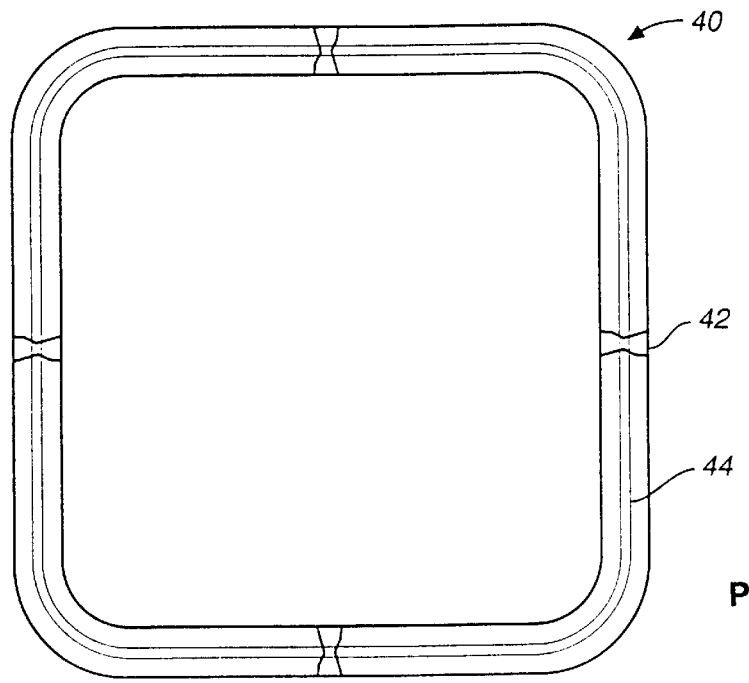
PRIOR ART
FIG._3
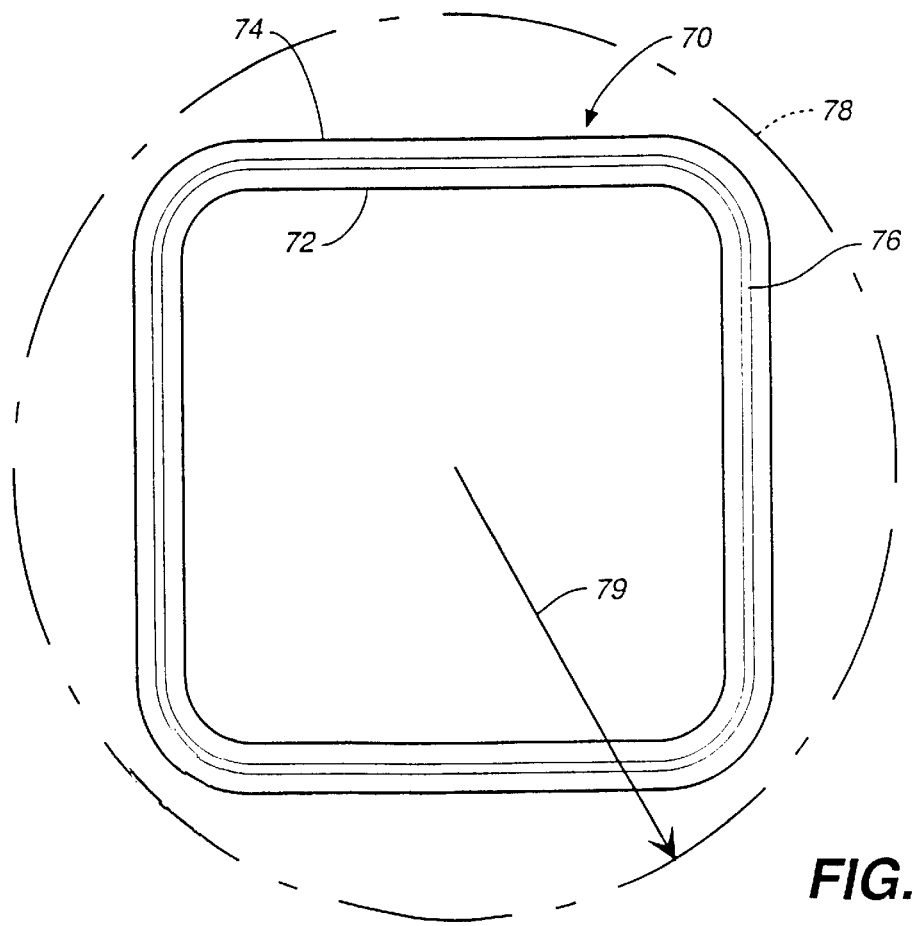
FIG._4

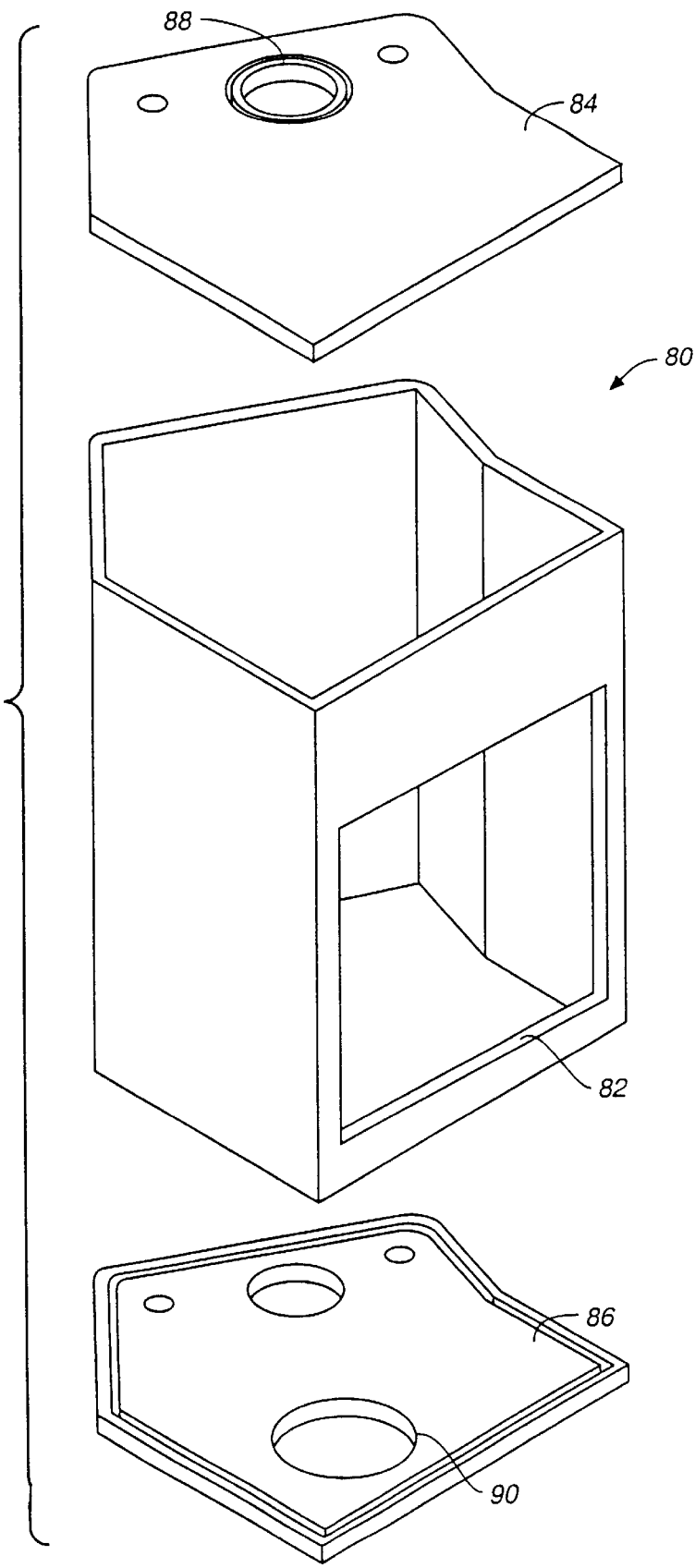
FIG._5

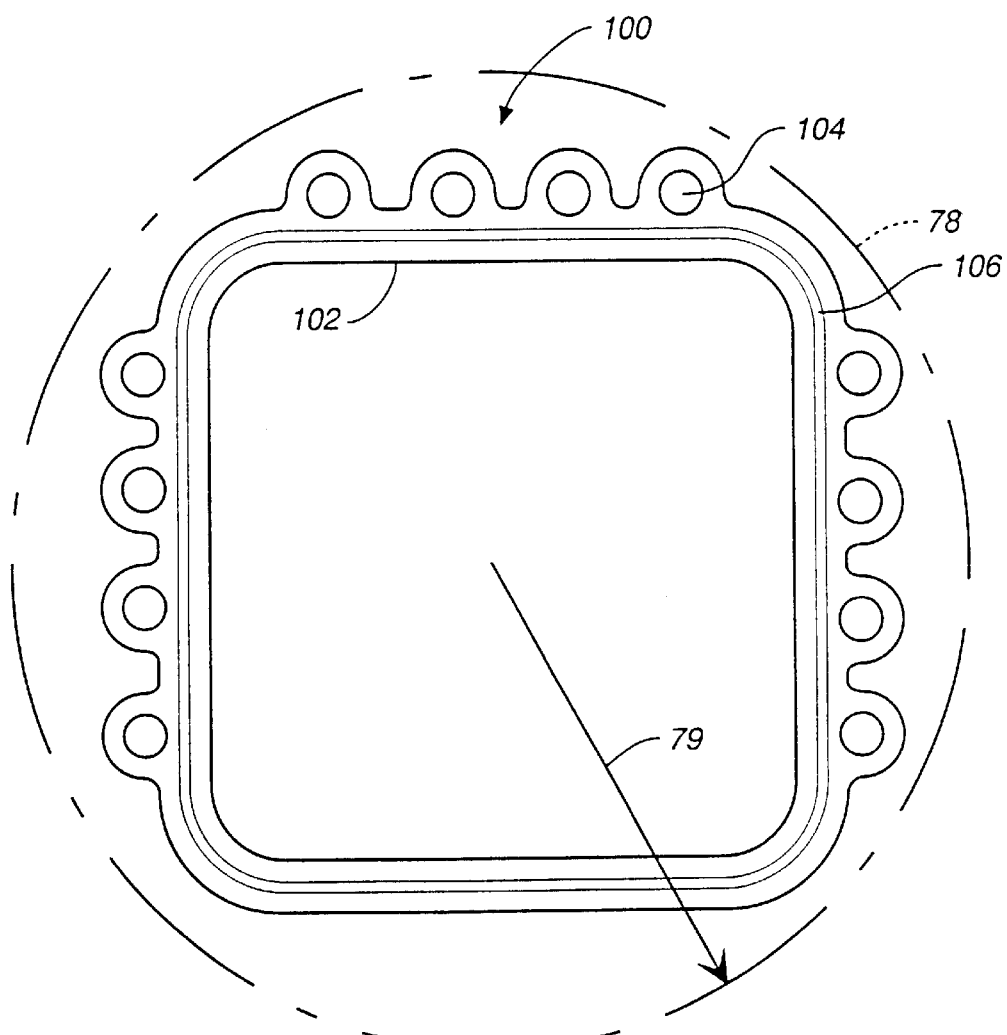
FIG._6

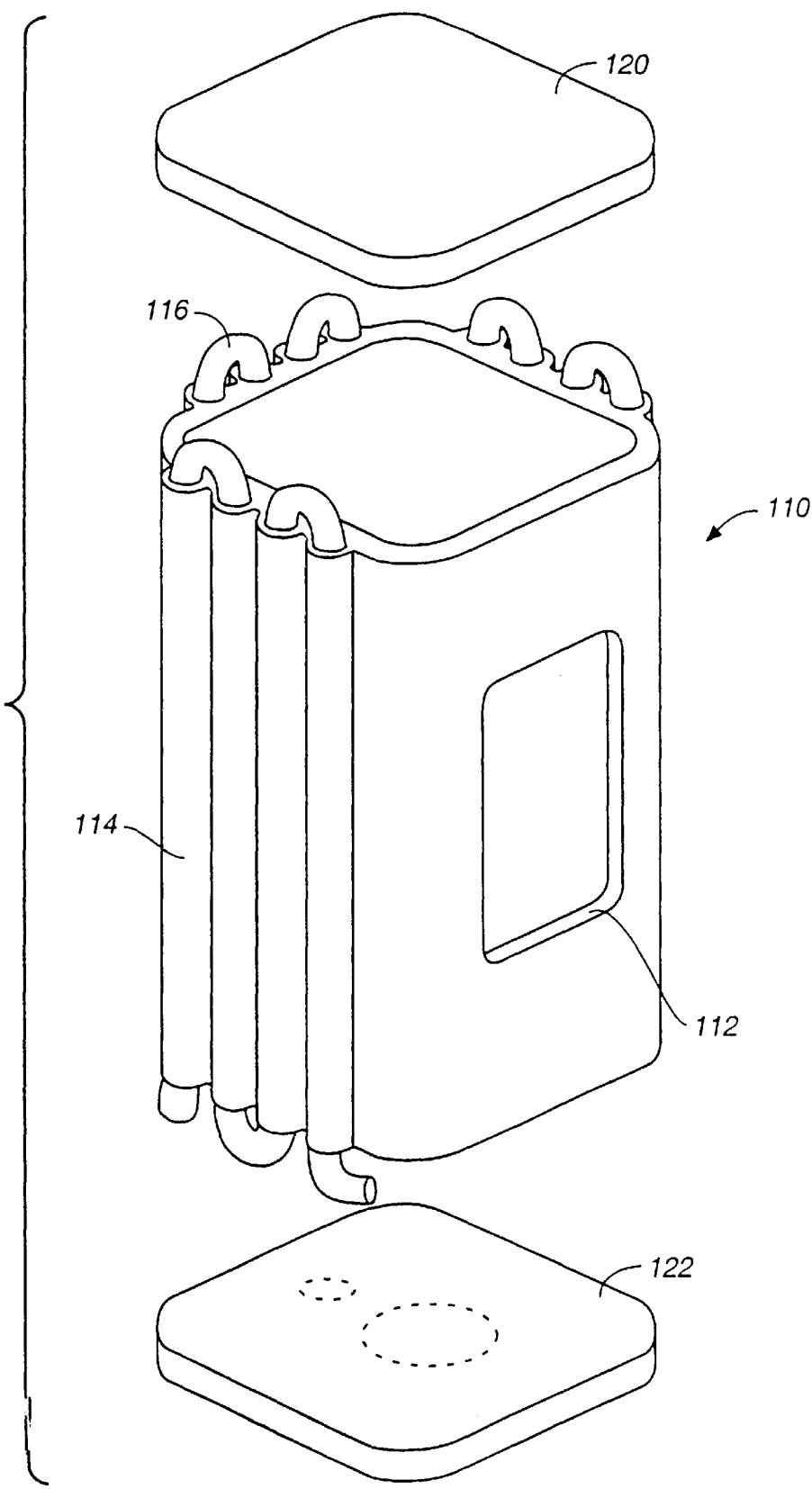
FIG._7

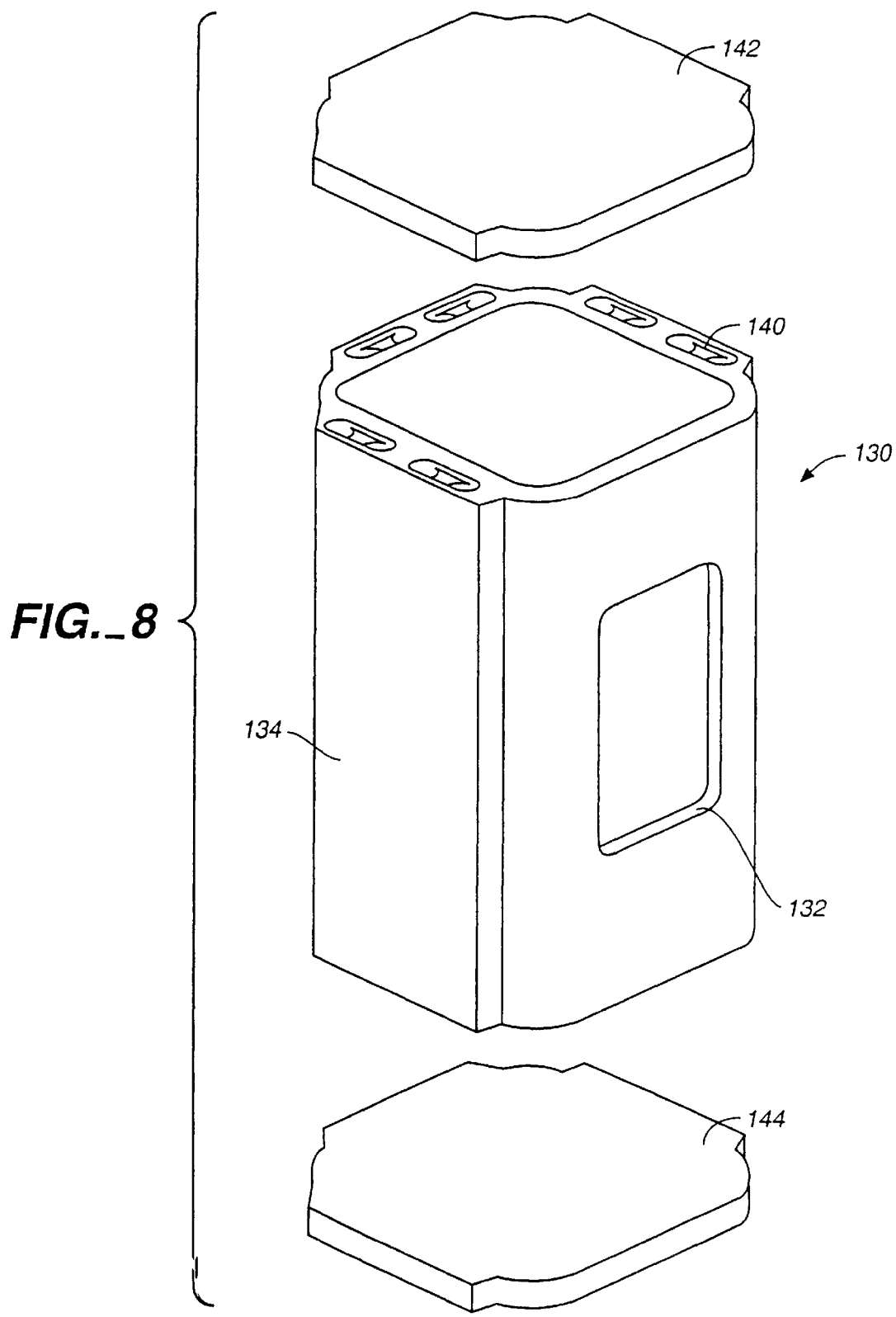
FIG._8

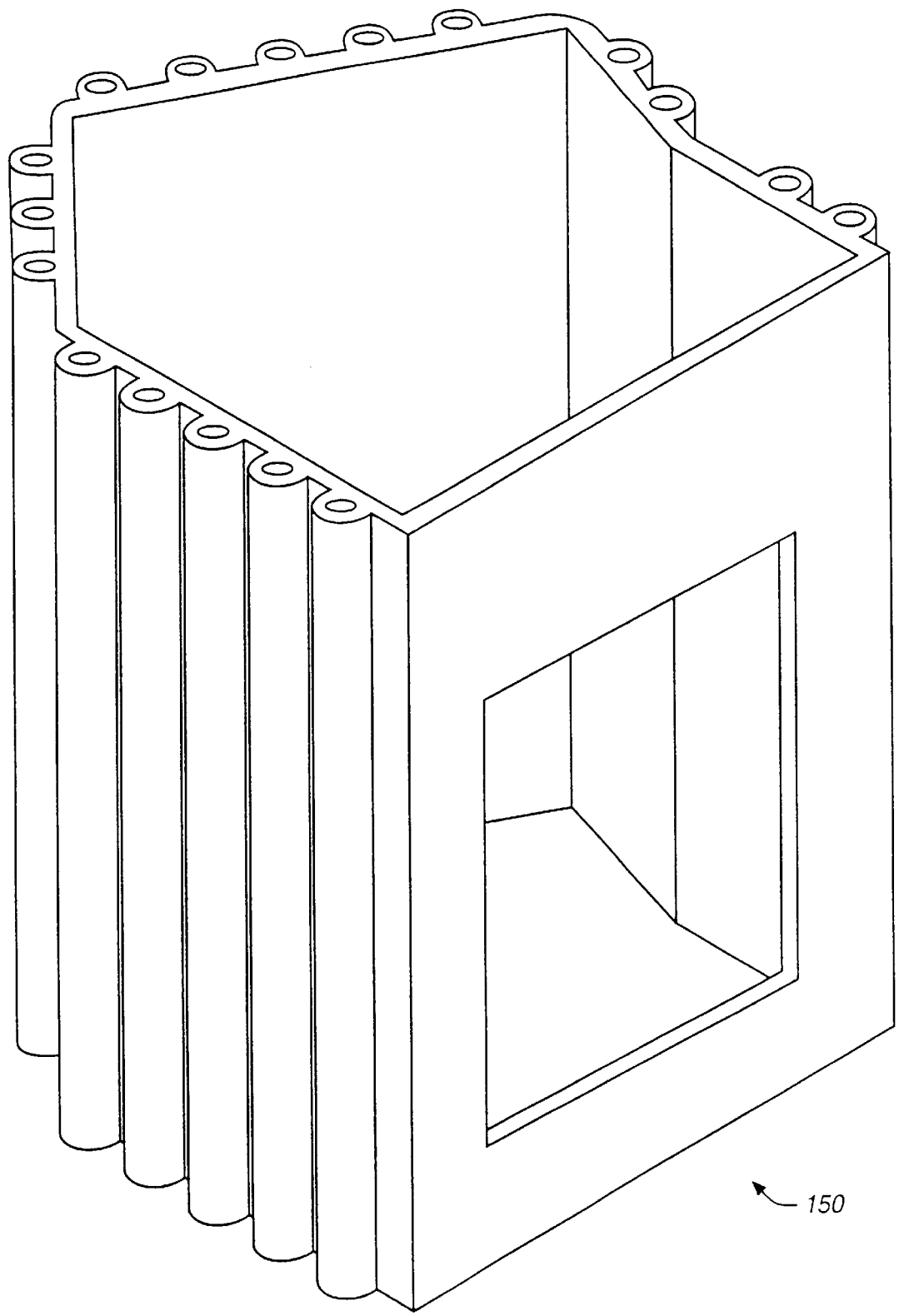
FIG._9

METHOD FOR PRODUCING VACUUM PROCESSING CHAMBERS

CROSS REFERENCE TO RELATED APPLICATIONS

This application is a divisional of application Ser. No. 09/151,187, filed Sep. 10, 1998, now U.S. Pat. No. 6,182,851, which is incorporated herein by reference, in its entirety, for all purposes.

FIELD OF THE INVENTION

This invention relates to the structure of the walls of a vacuum processing chamber and a method for producing vacuum processing chambers using extrusion technology to provide options and unexpected process improvements in processing semiconductor wafers.

BACKGROUND OF THE INVENTION

In vacuum processing in general, and in processing of substrates on which electronic elements are being formed in particular, the speed with which vacuum pressure is achieved in a vacuum chamber is a critical path step in achieving specified vacuum process conditions so that substrates can be cycled and processed. Similarly, once stable substrate processing conditions are achieved, maintaining the integrity of the low pressure process requires that the process environment remain stable by minimizing pressure transients both short and long term which may cause or contribute to anomalies in process conditions.

The current state of the art is such that short fat substrate vacuum processing chambers are machined from a solid block of the base material. As a result, as much as 80% of the material is cut away before the final chamber configuration is arrived at. Similarly in cluster arrangements of processing chambers, the cluster tool housing is carved (machined) from a large block of the base material, again, much of it is wasted as it is cut away. The base material, usually a cast piece is specified to include a high degree of quality (material integrity) to assure that there are no openings through which gasses may leak into the chambers.

When tall narrow vacuum chambers are needed, the technique of machining material away from a block of base material is abandoned in favor of using large thick plates. Such plates are bent 90° to form an L-shaped cross section. An example of L-shaped cross section plates is shown in FIG. 1 (e.g., 22). Four of these L-shaped cross sections are welded together at their edges using butt welding techniques to form a tube which acts as the wall of the processing chamber. An example of the construction of this type of prior art arrangement is shown in FIG. 1. A set of four corner panels 22, 24, 26, and 28, having been bent into L-shaped pieces are complimented by a top plate 32 and a bottom plate 34. The location of a future substrate access opening is shown by dashed lines 30. The whole configuration of elements defines a process chamber assembly 20, which in this case is a relatively tall and thin load lock module as would be used associated with a cluster tool.

Once fixed elements of the process chamber assembly are joined by welding the configuration as seen in FIG. 2 is formed. The four corner panels 22, 24, 26, 28 having been welded together by four butt weld type joints whose weld region and heat affected zone are depicted by weld regions 52, 54, 56, and 58. Welding is done inside and out. Since the only performance criteria for the welds is pressure sealing, grinding and multipass welding is not uniformly performed, as is done in welds where the highest degree of quality assurance is required by specification. The bottom plate 34 is welded to the bottom of the tube formed by the welded plates. The weld region and heat affected zone of the bottom weld is represented by the lower weld area (heat affected zone) 60. Again the welding is done both inside and out, the inside weld being difficult to perform as it is being done at the bottom end extreme corner of a narrow closed end tube. Both the sidewall and bottom plate welds are minimally inspected and often contain inclusion, voids, and porosity.

Similarly the corners of the sidewall plates where they were bent contain, surface defects which are created or accentuated by the bending of the thick plate (for example—¾ inches (19.05 mm) thick).

As a result of the side and bottom plates being welded their final dimensions are uncertain, for example an O-ring groove 44 (shown in FIG. 3) in the end surface of the tube assembly, is intended to be centered in the end surface, with a particular configuration. Because the locations (dimensions) of the inside and outside surfaces vary slightly depending on how the welding was completed, before machining a rectangularly configured O-ring groove in the end surface of the tube, a machinist or machine tool must go through measuring steps to find a datum line between the inside and outside surfaces and then calculate where the machining should take place so that the O-ring groove when completed does not approach either an inner or an outer surface too closely.

An end view of the processing chamber of FIG. 2 is shown in FIG. 3. The locations of heat affected, weld zones are shown on each side (e.g., 42). The O-ring groove 44 is cut in the end surface to mate with the removable (top) cover plate.

A parameter specified in the material specification for a finished product is surface finish. Once all welding and machining is complete, a specified surface finish must be achieved on the surfaces of the plates both inside and out. Often the treatment of the surfaces to achieve a specified surface finish is a hand operation which is time consuming and variable. Inspection of such finishes is also subject to high rate of rejection for refinishing. It would be preferred to reduce the variability, improve uniformity, and reduce the time associated with achieving an acceptable surface finish.

Conventional vacuum chamber vacuum standards, find both machined and welded vacuum chamber structures acceptable when they are deemed tight, in that a vacuum pressure of $10^{-9}$ torr can be reached quickly and vacuum pressures of $10^{-5}$ to $10^{-8}$ torr can be maintained during processing. Improvements in vacuum performance are desired as a typical pumpdown time for a system is 20% (at the initial stage and further pump down required every time a wafer is being loaded and unloaded). A reduction in the pump down time can significantly affect product throughput.

SUMMARY OF THE INVENTION

A configuration and method according to the invention provides an unexpected improvement in vacuum chamber and vacuum processing within vacuum chambers in that the time to achieve a vacuum level of $10^{-9}$ torr is significantly reduced (approximately 15%) from that when using welded structures. Further, the use of an extrusion die provides a consistency and uniformity among all extrusions being drawn from the same die. Therefore, the time steps needed to perform datum measurements, necessary to effectively machine welded structures, are not necessary when extruded structures are used. Further, use of an extruded structure eliminates the volumetric porosity in the wall material, reduces surface cracking, provides a consistent surface finish, and eliminates undesirable inclusions that readily appear when large plates are bent and then welded. Because of the high degree of material integrity in the wall of the chamber and the elimination of side wall welds and complications associated with machining through such welds, both the bottom and top edges of the extruded tube can be machined for O-ring grooves to receive top and bottom sealing plates which can be bolted to the top and bottom of the extruded tube. Such bolting eliminates the need for special treatment and/or quality control when using a welded joint and also reduces the complications associated with constructing and using a pressure vessel having an end which has been welded shut. Those complications include the requirement that a portion of the well be done deep inside a tube at its end. In the prior art structure, is hard to check the integrity of such a weld. Cleaning of a vacuum chamber constructed with a closed end (as in the prior art) requires careful attention to cleaning of the extreme bottom end and the corner between the end cap and the side wall to be sure that all deleterious substances are removed. In contrast, a structure according to present invention allows the end caps to be removed to access the inside of the side walls easily from both ends which thereby eliminates corners once the top and bottom plates are removed. In this configuration the side walls can be cleaned directly and the top and bottom plates can be cleaned directly as well.

In an extruded configuration according to the present invention, it is possible to extrude a pressure vessel side wall while including voids or tubes in the side wall separated from the pressure vessel space. In such an arrangement, cooling or heating liquid can be circulated through the separate tubes to directly heat or cool the side of the pressure vessel. Such an arrangement/configuration provides greatly increased efficiency in terms of the production of a heated or cooled pressure vessel by eliminating the step of having to attach by welding, brazing or other methods, a set of cooling type coils or pipes carrying a thermal transfer liquid to the outside of a pressure vessel. Secondly, the integration of the cooling channels enhances the transfer of thermal energy between the liquid flowing through the cooling/hearing channels and the material of the side well, as compared to the small weld or brazing area that is utilized when external tubing or piping is welded or brazed to the outside of a pressure vessel. Any imperfect connection between such tubing and a pressure vessel would cause differential thermal expansion which may create gaps that further reduce the thermal conductivity between the fluid flowing and the cooling channels in the side wall of the chamber.

In a preferred configuration, linear tubing passages are configured within the wall of the chamber. The ends of the heat transfer tubes in the walls of the chamber are connected by a series of connecting conduits between individual passages of the series of preferably tubular passages. Or, the ends of conduits in the wall can be undercut to provide a passage between adjacent tubes at the top and bottom of the extruded sidewall ends so that a flat plate covering the tube and passages will seal the fluid passage between adjacent individual passages.

A 15% improvement in pumpdown time translates into a 3% overall improvement in substrate (wafer) throughput. A leak rate improvement of three to five times can translate into a 3 to 5% faster throughput cycle. Since a 0.25% throughput improvement is considered "significant" in the substrate processing industry, a 3 to 5% improvement is not only significant, but substantial.

A method according to the invention includes the steps of extruding a tube to be used as pressure vessel; machining its ends surfaces to receive O-rings and machining its side surfaces to accommodate transfer mechanisms and doors as needed for processing operations.

A BRIEF DESCRIPTION OF THE DRAWINGS

FIG. 1 is a perspective exploded view of L-shaped sidewall pieces of a prior art load lock chamber prior to their being welded and assembled;

FIG. 2 is a perspective view of a welded up prior art load lock chamber the construction elements of which are shown in FIG. 1;

FIG. 3 is an end view of the load lock chamber of FIG. 2;

FIG. 4 is an end view of a load lock chamber in a configuration according to the invention;

FIG. 5 is an exploded perspective view of a load lock chamber configured in accordance with the invention;

FIG. 6 is an end view of a load lock chamber extrusion with integral tubular passages end outside its wall separate from the center space of the vessel;

FIG. 7 is an exploded perspective view of a load lock chamber according to the invention having external tubular passages for heating and cooling of the type as show in FIG. 6 where those heating and external tubular passages are configured in a series flow pattern by a set of tubular or piping members;

FIG. 8 is a exploded perspective view of a load lock chamber according to the invention having peripheral tubular passages integral with the wall of the chamber where three side walls of the chamber containing fluid passages are of uniform thickness; and FIG. 9 is a perspective view of a load lock chamber of the type shown in FIG. 5 having external tubular passages.

DETAILED DESCRIPTION

Extrusions of small items in the range of ¼ to 6" in diameter or across is commonly seen in many kinds of industrial parts. Extrusions for a large piece as presented herein, up to 24 or 27" in diameter, for use as a pressure vessel is previously unknown. FIG. 4 details the use of a generally square load lock chamber wall cross section 70. It has an inside surface 72 which faces the inside space of the pressure vessel and has an outside surface 74 still contained within the radius of the extrusion limit 79 as shown by the dashed line 78. The dashed line 78 shows the circle of the extrusion limit which in this instance is approximately 350 millimeters radius (700 millimeter diameter) to extrude the side wall assembly 70 shown. Once extruded, an O-ring groove 76 can be easily machined into the end once the piece is cut in lengths of approximately 24 to 30" to form load lock chambers.

FIG. 5 shows an extruded load lock assembly 80 into a side of which is machined a transfer hole 82 and to which an extruded arrangement top plate 84 can be bolted. Similarly, an extruded arrangement bottom plate 86 can be bolted to the bottom. The extruded arrangement top plate 84 includes piping nozzles (for example as shown by 88) for attaching gas and vacuum flow piping and tubing to the top of the chamber. Similarly, a bottom plate includes nozzle openings (for example 90) in the bottom plate to connect to vacuum pumps and gas feed or evacuation devices.

FIG. 6 shows an end of an extruded tube with integral cooling channels 100 wherein the inside wall 102 again faces an internal tubular space while the side wall top and bottom end surfaces include an O-ring groove 106 at its end inside a series of cooling tube openings in the integral wall of the chamber, for example as shown by 104. The extrusion radius 79 and a limit of the extrusion circle 78 are consistent with that previously described for FIG. 4 above.

FIG. 7 shows a prospective exploded view of a extruded thermally conditionable load lock assembly 110. The side wall includes a substrate transfer opening 112 in one wall and a series of ribs 114 containing cooling passages. The ends of the cooling passages are connected by U-shaped piping connections, for example 116 both at the top and bottom with the end passages being connected to tubing and external pumps. While a serial path for the tubing connections is shown, the piping connections could configured to have a parallel, straight through, or multiple pass flow configuration. Thermal sensors inside the chamber can be matched to the thermal flow pattern in the passages in the sidewalls to achieve variations and/or uniformity as required for a particular process. A removable top seal plate 120 seals the top opening of the tubular sidewall structure, inside the piping connection 116. Similarly a bottom removable seal plate 122 seals inside piping connections on the bottom. The top and bottom seal plates are bolted to the top and bottom through bolt holes not shown in this figure.

FIG. 8 shows an alternate arrangement of a configuration according to the invention with an extruded thermally load lock assembly 130 having a substrate transfer opening 132 in a side wall. The thickened wall, e.g., 134, of the three sides shown provides a larger thermal mass for heating and cooling of the contents of the chamber but also provides a larger area for extrusion which requires a greater force and some additional complexity in extruding the sidewall. A series of tubes similar in configuration to those shown in FIG. 7 exist in the side wall in the assembly as shown in FIG. 8. Undercut grooves 140 are machined between adjacent grooves to replace the piping connections 116 shown in FIG. 7. In this way a top plate 142 and a bottom plate 144 can be generally flat without requiring special machining or sealing to accommodate tubes around it and also eliminates the complication of installing and sealing numerous U-shaped separate tubing arrangements in the tubular side wall pieces.

FIG. 9 shows an alternate embodiment of an extruded load lock sidewall with cooling passages 150. The general shape of the sidewall configuration matches the shape of the extruded load lock shown in FIG. 5, and includes raised ribs containing cooling passages as discussed above.

The benefits of improved material quality, ease of manufacture, uniformity of dimension, and improved surface finish uniformity along with the completely unexpected result of a quantum improvement in vacuum performance provide advantages not known or expected from the prior art.

While the invention has been described with regards to specific embodiments, those scaled in the art will recognize that changes can be made in form or detail without departing from the spirit and scope of the intention.

What is claimed is:

1. A method of producing a vacuum containment vessel comprising the steps of:

extruding a tubular body element, the tubular body element encircling a central space, said tubular body element having a body side and a first open end and a second open end;

providing sealable openings in the side of the tubular body element;

attaching a first end closure to seal said first end of said tubular body element and attaching a second end closure to seal said second end of said tubular body element.

2. The method of producing a vacuum containment vessel as in claim 1, wherein said tubular body element includes a series of tubular passages in the wall of said body element separated from said central space by a portion of said body element.

3. The method of producing a vacuum containment vessel as in claim 2, further comprising the step of:

providing fluid communication between at least two tubular passages of said series of tubular passages in the wall of said body element.

4. The method of producing a vacuum containment vessel as in claim 3, wherein said step of providing fluid communication includes providing grooved passages in the end surfaces of the tubular body element, such that when sealed by a cover said end closures, thermal transfer fluid flowing from a first of said tubular passages in the wall of said body element passes through one of said grooved passages in the end of an tubular body element and into a second of said tubular passages in the wall of said body element.

5. A method of producing a vacuum containment vessel, the method comprising:

extruding a tubular body element, the tubular body element encircling a central space, the tubular body element having a body side and a first open end and a second open end;

providing a sealable opening in the body side of the tubular body element;

attaching a first end closure to seal the first open end of the tubular body element; and attaching a second end closure to seal the second open end of the tubular body element.

6. The method of producing a vacuum containment vessel as in claim 5, wherein the tubular body element includes a series of tubular passages therein, the series of tubular passages being separated from said central space by a portion of the tubular body element.

7. The method of producing a vacuum containment vessel as in claim 6, further comprising:

providing fluid communication between at least two tubular passages of the series of tubular passages.

8. The method of producing a vacuum containment vessel as in claim 7, wherein providing fluid communication includes providing grooved passages in an end surface of the tubular body element, such that when sealed by one of such said end closures, thermal transfer fluid flowing from a first of said tubular passages in the wall of said body element passes through one of the grooved passages in the end of the tubular body element and into a second of the tubular passages.

9. A method of manufacturing an article for use in processing a semiconductor wafer, the method comprising:

extruding a tubular element, the tubular element encircling a central space, the tubular element having a side and open ends;

forming an opening in the side of the tubular element, the opening being sized so as to permit the semiconductor wafer to be processed to be transferred into and out of the central space.

10. The method of manufacturing an article of claim 9, the method further comprising:

attaching an end closure to an open end of the tubular element.

11. The method of manufacturing an article of claim 9, wherein the tubular element is extruded so that the tubular element includes a series of peripheral tubular passages integral therewith and separated from the central space by a portion of the tubular element, the series of peripheral tubular passages being isolated from the central space.

12. The method of manufacturing an article of claim 9, wherein the tubular element is extruded so as to provide a series of ribs integral therewith for containing peripheral tubular passages separated from the central space by a portion of the tubular element, the series of peripheral tubular passages being isolated from the central space.

13. A method of manufacturing an article for use in processing a semiconductor wafer, the method comprising:

extruding a tubular element, wherein the tubular element encircles a central space, wherein the tubular element has a side and open ends, and wherein the tubular element is extruded so that the tubular element includes a series of peripheral tubular passages integral therewith and separated from the central space by a portion of the tubular element, the series of peripheral tubular passages being isolated from the central space; and providing fluid connection between the series of peripheral tubular passages.

14. The method of manufacturing an article of claim 13, the method further comprising:

forming an opening in the side of the tubular element, the opening being sized so as to permit the semiconductor wafer to be processed to be transferred into and out of the central space.

\* \* \* \* \*